United States Patent
Erdmann et al.

(10) Patent No.: US 9,054,096 B2
(45) Date of Patent: Jun. 9, 2015

(54) NOISE ATTENUATION WALL

(71) Applicant: Xilinx, Inc., San Jose, CA (US)

(72) Inventors: Christophe Erdmann, Dublin (IE);
Edward Cullen, Clane (IE); Donnacha Lowney, Dublin (IE)

(73) Assignee: XILINX, INC., San Jose, CA (US)

( * ) Notice: Subject to any disclaimer, the term of this patent is extended or adjusted under 35 U.S.C. 154(b) by 228 days.

(21) Appl. No.: 13/626,829

(22) Filed: Sep. 25, 2012

(65) Prior Publication Data
US 2014/0084477 A1    Mar. 27, 2014

(51) Int. Cl.
*H01L 23/552* (2006.01)
*H01L 23/498* (2006.01)
*H01L 23/66* (2006.01)
*H01L 23/538* (2006.01)
(Continued)

(52) U.S. Cl.
CPC ........ *H01L 23/49827* (2013.01); *H01L 23/552* (2013.01); *H01L 23/5384* (2013.01); *H01L 23/66* (2013.01); *H01L 24/16* (2013.01); *H01L 25/0655* (2013.01); *H01L 2223/6622* (2013.01); *H01L 2224/16225* (2013.01); *H01L 2924/14* (2013.01); *H01L 2924/1431* (2013.01); *H01L 2924/1434* (2013.01); *H01L 2924/15311* (2013.01)

(58) Field of Classification Search
CPC .................................................. H01L 23/552
USPC ............ 257/276, 621, 547, 659, 700, E25.03; 361/818
See application file for complete search history.

(56) References Cited

U.S. PATENT DOCUMENTS

| 6,362,525 B1 * | 3/2002 | Rahim .......................... 257/738 |
| 6,686,649 B1 | 2/2004 | Mathews et al. |
| 2004/0188827 A1 * | 9/2004 | Akashi .......................... 257/700 |

(Continued)

FOREIGN PATENT DOCUMENTS

| DE | 10 2006 022 360 A1 | 11/2007 |
| EP | 2019427 A1 | 1/2009 |

(Continued)

OTHER PUBLICATIONS

Uemura, Schinichiro et al., "Isolation Techniques Against Substrate Noise Coupling Utilizing Through Silicon Via (TSV) Process for RF/Mixed-Signal SoCs", IEEE Journal of Solid-State Circuits, vol. 47, No. 4, Apr. 2012, pp. 810-816.

(Continued)

*Primary Examiner* — Colleen A Matthews
*Assistant Examiner* — William Harriston
(74) *Attorney, Agent, or Firm* — W. Eric Webostad; Robert M. Brush

(57) ABSTRACT

An embodiment of an apparatus is disclosed. For this embodiment of the apparatus, an interposer has first vias. First interconnects and second interconnects respectively are coupled on opposite surfaces of the interposer. A first portion of the first interconnects and a second portion of the first interconnects are spaced apart from one another defining an isolation region between them. A substrate has second vias. Third interconnects and the second interconnects are respectively coupled on opposite surfaces of the package substrate. A first portion of the first vias and a first portion of the second vias are both in the isolation region and are coupled to one another with a first portion of the second interconnects.

17 Claims, 9 Drawing Sheets

(51) Int. Cl.
*H01L 23/00* (2006.01)
*H01L 25/065* (2006.01)

(56) References Cited

U.S. PATENT DOCUMENTS

| | | |
|---|---|---|
| 2007/0262422 A1 | 11/2007 | Bakalski et al. |
| 2008/0179718 A1* | 7/2008 | Wu .................................. 257/659 |
| 2010/0078771 A1 | 4/2010 | Barth et al. |
| 2012/0217624 A1 | 8/2012 | Morris et al. |

FOREIGN PATENT DOCUMENTS

| | | |
|---|---|---|
| GB | 2 238 911 A | 6/1991 |
| WO | WO 02/067326 A2 | 8/2002 |
| WO | WO 2011/086613 A1 | 7/2011 |

OTHER PUBLICATIONS

Ponchak, G.E., et al., "The Use of Metal Filled Via Holes for Improving Isolation in LTCC RF and Wireless Multichip Packages," IEEE Transactions on Advanced Packaging Feb. 2000, pp. 88-99, vol. 23, IEEE, Piscataway, New Jersey, USA.

* cited by examiner

NOISE ATTENUATION WALL

FIELD OF THE INVENTION

An embodiment relates to integrated circuit devices ("ICs"). More particularly, an embodiment relates to an IC package with a noise attenuation wall.

BACKGROUND

Integrated circuits have become more "dense" over time, i.e., more logic features have been implemented in an IC of a given size. Furthermore, multiple integrated circuit dies may be implemented in a same IC package. Whether from a single IC or an IC package of multiple dies, there is more opportunity for one signal to cause interference or noise on another signal, namely crosstalk. Hence, it is desirable to provide an IC package having reduced crosstalk.

SUMMARY

One or more embodiments generally relate to an IC package with a noise attenuation wall.

An embodiment relates generally to an apparatus. In such an embodiment, an interposer has first vias. First interconnects and second interconnects respectively are coupled on opposite surfaces of the interposer. A first portion of the first interconnects and a second portion of the first interconnects are spaced apart from one another defining an isolation region between them. A package substrate has second vias. Third interconnects and the second interconnects are respectively coupled on opposite surfaces of the package substrate. A first portion of the first vias and a first portion of the second vias are both in the isolation region and are coupled to one another with a first portion of the second interconnects.

Another embodiment relates generally to another apparatus. In such an embodiment, a circuit platform has vias. The circuit platform includes at least one first conductor not connected to the vias. The circuit platform further includes at least one second conductor not connected to the vias. The vias are spaced apart from one another to provide a noise attenuation wall. The vias surround the at least one second conductor to provide a noise barrier between the at least one second conductor and the at least one first conductor. The at least one first conductor is located outside of the noise attenuation wall.

Yet another embodiment relates generally to yet another apparatus. In such an embodiment, a die has through substrate vias, transistors, and at least one conductive layer. The at least one conductive layer interconnects the through substrate vias to one another. The through substrate vias are spaced apart from one another to provide a noise attenuation wall. A first conductor is located on a first side of and not interconnected to the noise attenuation wall. A second conductor is located on a second side of and not interconnected to the noise attenuation wall. The first conductor is for conducting a first signal. The second conductor is for conducting a second signal. The first signal is a noise aggressor with respect to the second signal wall. The noise attenuation wall is located between the first conductor and the second conductor to reduce noise caused by the first signal from being induced onto the second signal.

BRIEF DESCRIPTION OF THE DRAWINGS

Accompanying drawings show exemplary embodiments. However, the accompanying drawings should not be taken to limit the embodiments shown, but are for explanation and understanding only.

FIGS. 2-1 through 2-4 are block diagrams of cross-sectional views depicting respective exemplary embodiments of a device package.

FIG. 3 is a block diagram of a top elevation view depicting an exemplary embodiment of a circuit platform.

FIG. 4 is a block diagram of a top elevation view depicting another exemplary embodiment of a circuit platform.

DETAILED DESCRIPTION

Figure 1:
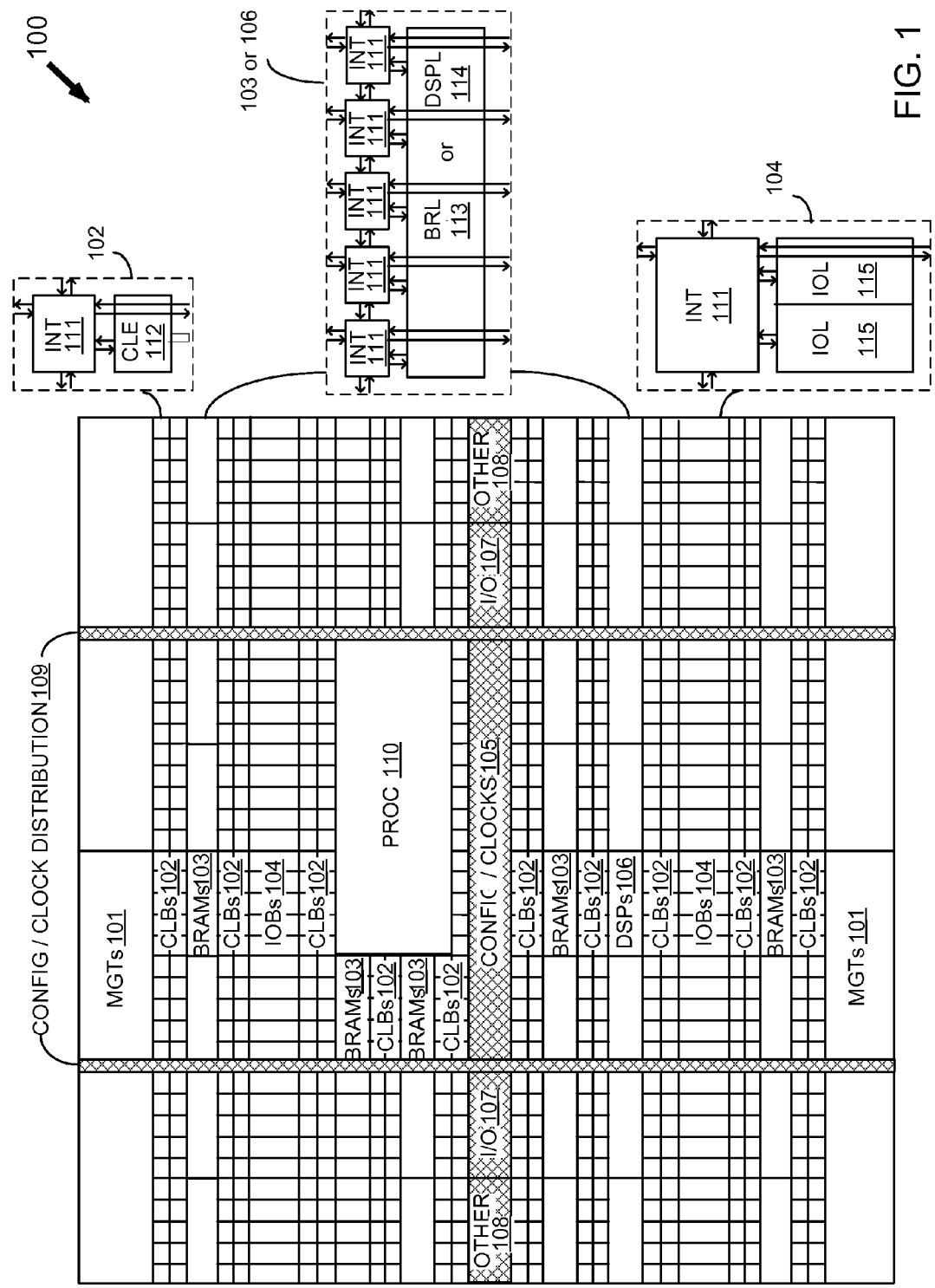
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding. Signals from one circuit cause noise in signals from another circuit. These interfering signals may be within the same integrated circuit package, where such integrated circuit package may include two or more integrated circuit dies. Such two or more integrated circuit dies may be coupled to a same interposer or carrier die ("interposer"), and such interposer may be coupled to a package platform member ("package substrate"). Such interposer generally is considered to be a passive interposer, namely a die without transistors. However, in another embodiment, an active interposer may be used, namely a die with one or more transistors. Furthermore, even though multiple die coupled to an interposer is described hereinbelow, it should be understood that noise shielding as described herein may be used for a single die.

In order to attenuate noise of aggressor signaling within an integrated circuit package, a noise attenuation wall as described below in additional detail may be used.

With the above general understanding borne in mind, various embodiments for a noise attenuation wall are generally described below.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figures 1, 2:
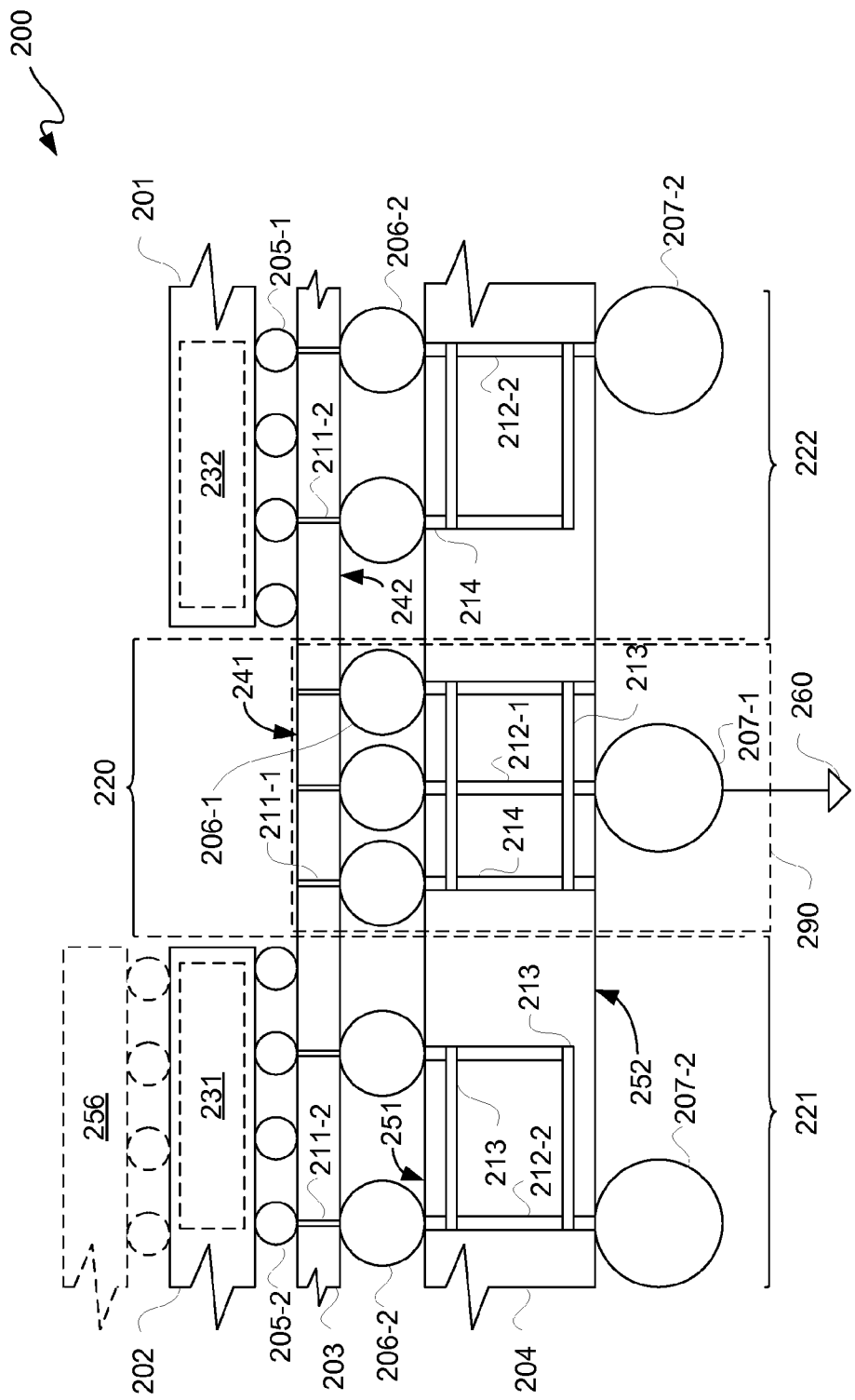
Figure 2:
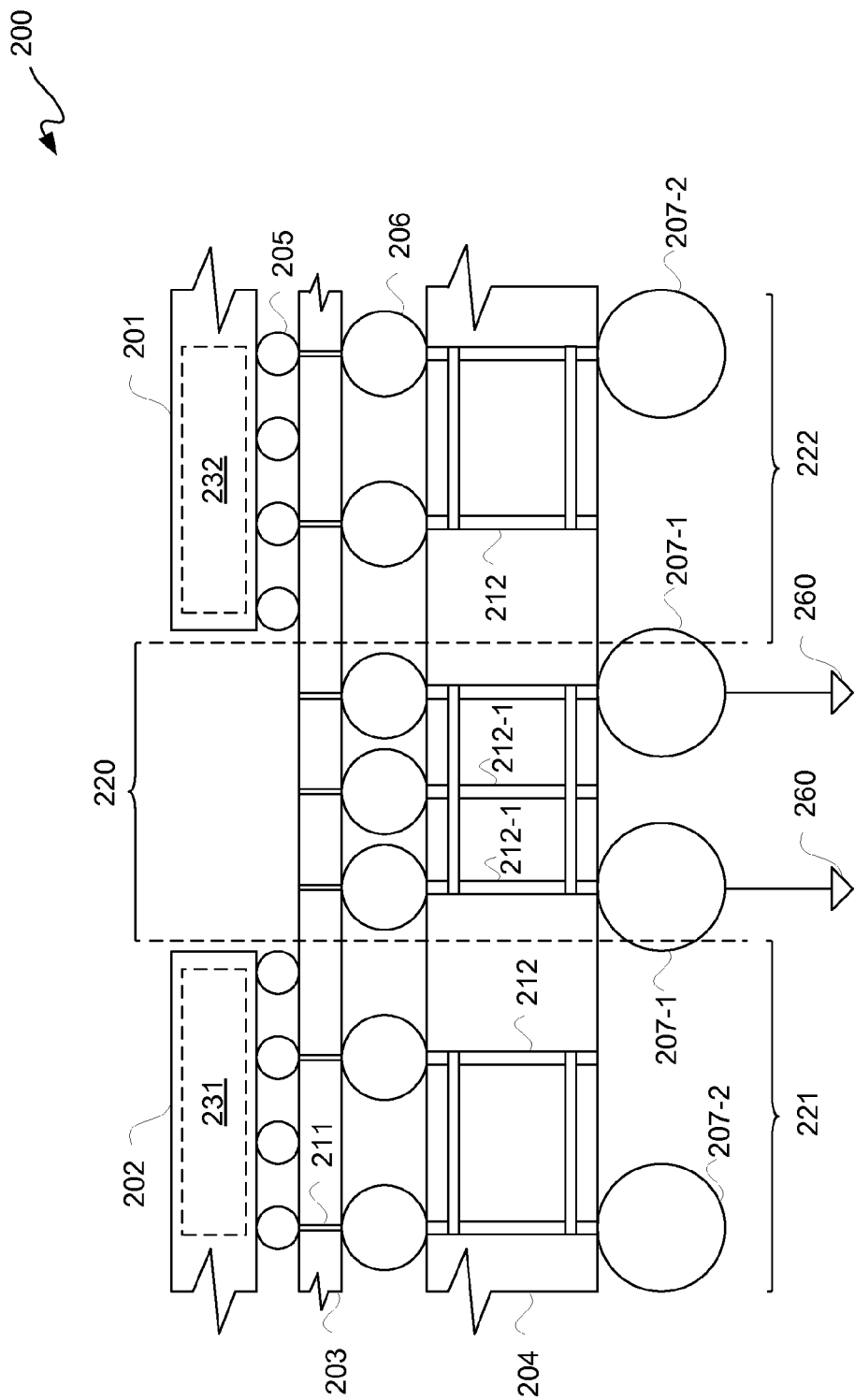

FIGS. 2-1 through 2-4 are block diagrams of cross-sectional views depicting respective exemplary embodiments of a device package 200. With reference to FIG. 2-1, device package 200 includes integrated circuit die 201, integrated circuit die 202, interconnects 205, circuit platform 203, interconnects 206, circuit platform 204, and interconnects 207. Optionally, device package 200 may include one or more die stacks, as generally indicated by an optional integrated circuit die 256 on top of integrated circuit die 202. Along those lines, it should be understood that the following description is applicable to having more levels of die than just two. However, for purposes of clarity and not limitation, two level die stacks are described below, even though in other embodiments morel levels of die may be used. More particularly, in an embodiment, interconnects 205 may be microbumps; circuit platform 203 may be an interposer or carrier; interconnects 206 may be C4 bumps; circuit platform 204 may be a package substrate; and interconnects 207 may be package balls. For purposes of clarity by way of example and not limitation, device package 200 is further described with reference to the above-listed terms. Additionally, integrated circuit dies 201 and 202 may both be a same type of IC, such as an FPGA die or some other type of IC die for example, or integrated circuit dies 201 and 202 may be different types of IC dies, such as some combination of an FPGA die, a memory die, a radio die, a power supply die, or some other type of IC die for example. Generally, a mix of one or more FPGA dies and one or more data converters dies, such as for example one or more analog-to-digital converter ("DAC"), digital-to-analog converter, and/or other data conversion dies for example, may be used.

Integrated circuit die 201 may include circuitry 232, and integrated circuit die 202 may include circuitry 231. Circuitry 232 may be analog or digital circuitry, and circuitry 231 may be analog or digital circuitry, where either of circuitry 231 and 232 interferes with the other. For purposes of clarity by way of example not limitation, it shall be assumed that circuitry 231 is a digital circuitry, and that circuitry 232 is analog circuitry. Furthermore, for purposes of clarity by way of example not limitation, it shall be assumed that noise caused by operation of circuitry 231, including without limitation digital signals passed to or from integrated circuit die 202 associated with operation of circuitry 231, generates noise which may cause "crosstalk" with respect to analog signals passed to or from integrated circuit die 201 associated with operation of circuitry 232. In this example, digital signals associated with operation of circuitry 231 are the aggressor signals, and analog signals associate with operation of circuitry 232 are the victim signals; however, in another embodiment, analog signals associated with operation of circuitry 232 may be the aggressor signals, and digital signals associate with operation of circuitry 231 may be the victim signals.

Microbumps 205 are used to couple integrated circuit dies 201 and 202 to interposer 203. More particularly, a first portion of microbumps 205, namely microbumps 205-1, are used to couple integrated circuit die 201 to interposer 203, and a second portion of microbumps 205, namely microbumps 205-2, are used to couple integrated circuit die 202 to interposer 203. In this example, integrated dies 201 and 202 are spaced apart from one another, along with microbumps 205-1 and 205-2, respectively, defining an isolation region 220 between such integrated circuit dies or sets of microbumps.

Heretofore, isolation region 220 may not have included circuitry as described below herein for attenuating noise from an aggressor signal with respect to a victim signal, which meant isolation region 220 would have to be wider than such region when employing noise attenuating circuitry as described below in additional detail. Thus, without use of noise attenuating circuitry as described below herein, more circuit platform real estate would have to be consumed for providing noise isolation.

A top surface 241 of interposer 203 may be in contact with microbumps 205, and a bottom surface 242 of interposer 203 may be in contact with C4 bumps 206. In other words, microbumps 205 and C4 bumps 206 may be respectively coupled on opposite surfaces of interposer 203.

One or more of microbumps 205 may be coupled to one or more of vias 211 of interposer 203. One or more of C4 bumps 206 may be coupled to one or more of vias 211 of interposer 203. Vias 211 may extend to top surface 241 and bottom surface 242. In other words, vias 211 may be "through circuit platform vias" or "through vias". Some of vias 211 may not extend all the way from top surface 241 to bottom surface 242 of interposer 203. For interposer 203 formed using a silicon substrate, vias 211 may be formed as Through Silicon Vias ("TSVs"). However, as described herein, vias 211 not only perforate a substrate, such as a semiconductor or dielectric substrate, but also may extend through all other layers formed on such substrate.

C4 bumps 206 may be used to couple interposer 203 with package substrate 204. Package substrate 204 may include vias 212. Like vias 211 of interposer 203, some of vias 212 may be "through vias." Along those lines, some of vias 212 may extend from a top surface 251 of package substrate 204 to a bottom surface 252 of package substrate 204. Vias 212 may be formed of one or more multiple conductive layers. For example, vias 212 may be formed of a single fill via layer 214, or a combination of generally vertical via layers 214 and generally horizontal trace layers 213. Two or more vias 212 may be coupled to one another by one or more trace layers 213.

C4 bumps 206 may thus be in contact with top surface 251 of package substrate 204, and package balls 207 may be in contact with bottom surface 252 of package substrate 204. In other words, C4 bumps 206 and package balls 207 may be on opposite surfaces of package substrate 204.

A portion of vias 211, C4 bumps 206, vias 212, and package balls 207 are located, at least in the main, in isolation region 220. Other portions of vias 211, C4 bumps 206, vias 212, and package balls 207 are located, at least in the main, outside of isolation region 220, namely are located, at least for the most part, in regions 221 and 222. In order to delineate these two conditions, vias 211, C4 bumps 206, vias 212, and package balls 207 located, at least in the main, in isolation region 220 have a −1, and vias 211, C4 bumps 206, vias 212, and package balls 207 located, at least in the main, in regions 221 and 222 have a −2. Thus, vias 211-1, C4 bumps 206-1, vias 212-1, and package balls 207-1 are located, at least in the main, in isolation regions 220. Likewise, vias 211-2, C4 bumps 206-2, vias 212-2, and package balls 207-2 are located, at least in the main, in either regions 221 or 222. Continuing the above example, it shall be assumed that region 221 is a digital region corresponding to digital circuitry 231, and that region 222 is an analog region corresponding to analog circuitry 232.

In this exemplary embodiment, each of three vias 211-1 are coupled to three corresponding vias 212-1 using three C4 bumps 206-1, respectively. Vias 212-1 are coupled to one another with traces 213. A package ball 207-1 is coupled to a via of vias 211-1, and such package ball 207 is coupled to a ground 260. Even though all of vias 211-1 in this embodiment are effectively coupled to ground 260, not all of such vias 211-1 need to be coupled to ground to provide some noise shielding. Furthermore, even though ground 260 in this embodiment is an independent ground, namely not coupled to analog circuitry 232 nor digital circuitry 231, an independent ground need not be used in other embodiments. Furthermore, a ground does not necessarily have to be used for a fixed potential. In other embodiments, a sacrificial power supply network may be used in place of a ground depending on the application, such as for example for a low frequency digital control signal with sufficiently low noise.

Vias 211-1, C4 bumps 206-1, vias 212-1, and one or more package balls 207-1 in combination, where an external package ball 207-1 is coupled to a ground, may be used to provide a noise attenuation wall 290 between analog region 222 and digital region 221. Noise attenuation wall 290 is to attenuate noise generated by digital circuitry 231 with respect to impact on operation of analog circuitry 232. In another embodiment, where analog circuitry 232 is the aggressor, noise attenuation wall 290 may be used to attenuate noise generated by analog circuitry 232 with respect to impact on operation of digital circuitry 231. Effectively, noise attenuation wall 290 may be used to "absorb" noise generated by circuitry, and shunt such absorbed noise to ground. Noise attenuation wall 290 may be used to create any of a variety of configurations, as described below in additional detail.

Spacing between elements of noise attenuation wall 290 may vary, subject to pitch limits, to adjust electrical barrier porosity of such wall. Pitch of elements of noise attenuation wall 290 may be decreased, namely more closely spaced elements of noise attenuation wall 290, in order to reduce porosity to increase noise attenuation effectiveness. Moreover, pitch of elements of noise attenuation wall 290 may be increased, namely more widely spaced elements of noise attenuation wall 290, in order to increase ferocity to reduce noise attenuation effectiveness. Additionally, the number of rows or layers of elements of noise attenuation wall 290 may be increased or decreased to increase or decrease, respectively, noise attenuation effectiveness.

To recapitulate, any application involving isolation between different functions may incorporate a noise attenuation wall 290 as described herein. A fixed potential may be coupled to such noise attenuation wall 290 for absorption of noise. Spacing between elements of noise attenuation wall 290 may vary from application-to-application to tailor effectiveness, and configurations of noise attenuation wall 290 may vary from application-to-application to tailor effectiveness.

In digital region 221, a portion of microbumps 205-2 is coupled to a portion of C4 bumps 206-2 with vias 211-2. Furthermore, in digital region 221, a portion of vias 212-2 couple such portion of C4 bumps 206-2 to a portion of package balls 207-2. Such portion of vias 212-2 may be coupled to one another through one or more traces 213.

In analog region 222, a portion of microbumps 205-1 is coupled to a portion of C4 bumps 206-2 with vias 211-2. Furthermore, in analog region 222, a portion of vias 212-2 couple such portion of C4 bumps 206-2 to a portion of package balls 207-2. Such portion of vias 212-2 may be coupled to one another through one or more traces 213.

With reference to FIG. 2-2, another embodiment of a device package 200 is illustratively depicted. This embodiment the same as that of FIG. 2-1, except that two package balls 207-1 are used for coupling respective vias 212-1 to ground 260. Package balls 207-1 are mainly in isolation region 220; however, portions of such package balls 207-1 may extend into one or more of regions 221 and/or 222.

Figures 2, 3:
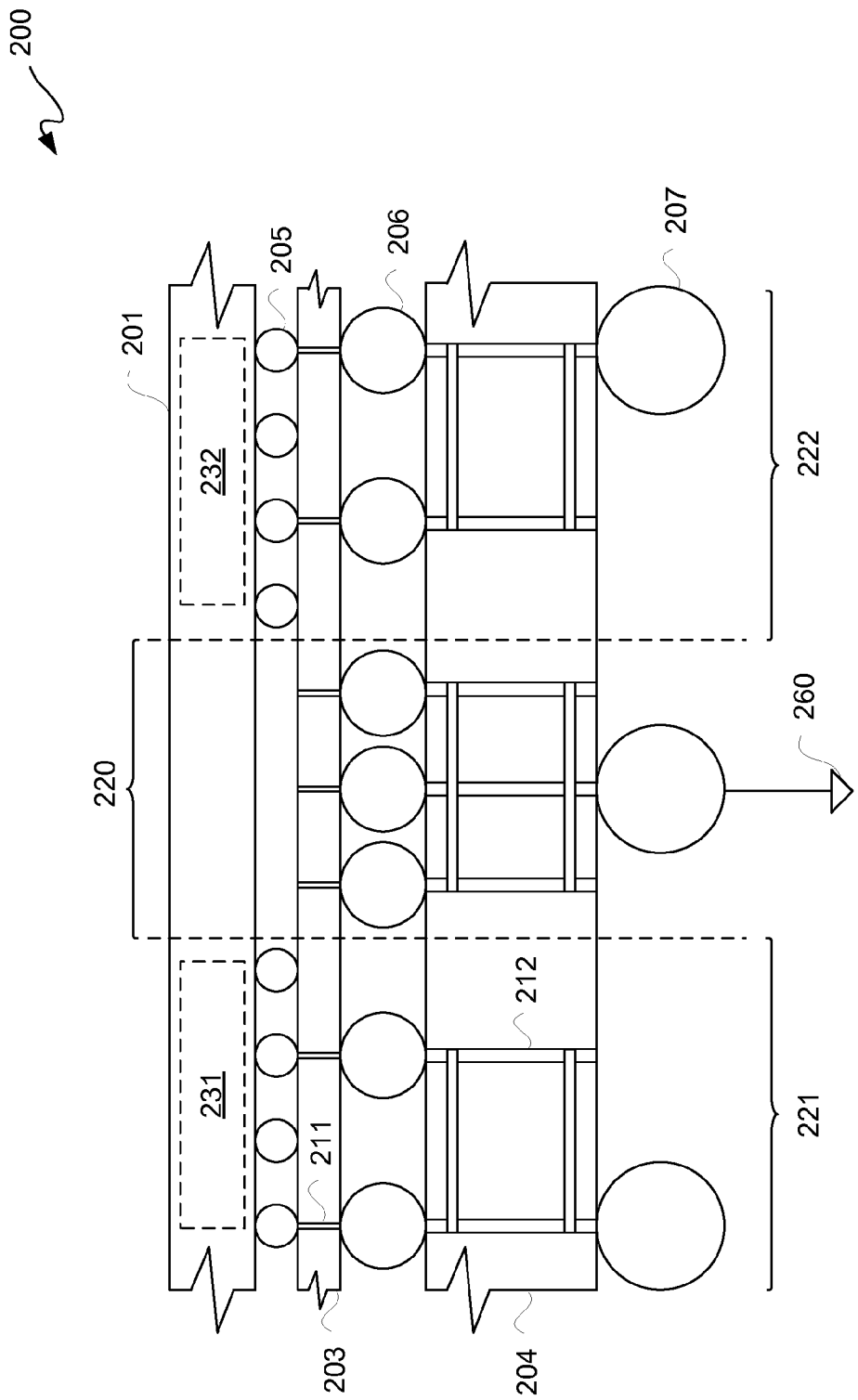

With reference to FIG. 2-3, yet another embodiment of a device package 200 is illustratively depicted. This embodiment the same as that of FIG. 2-1, except that a single integrated circuit die 201 having both digital circuitry 231 and analog circuitry 232 is illustratively depicted. Thus, in isolation wall 290 may be used to isolate separate circuitry portions of the same integrated circuit with respect to signals passing through an interposer 203, as well as a package substrate 204.

Figures 2, 3, 4:
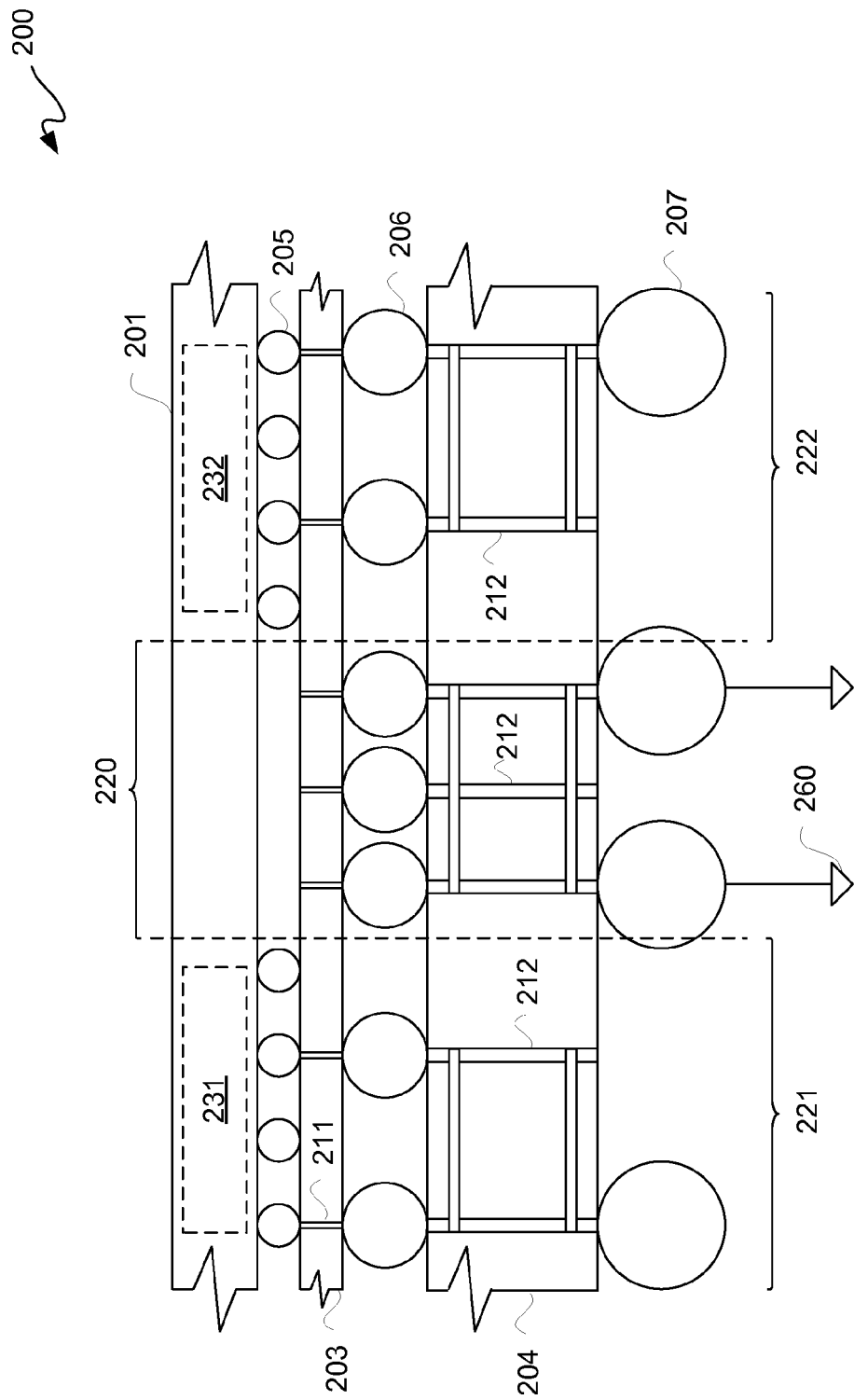
Figure 3:
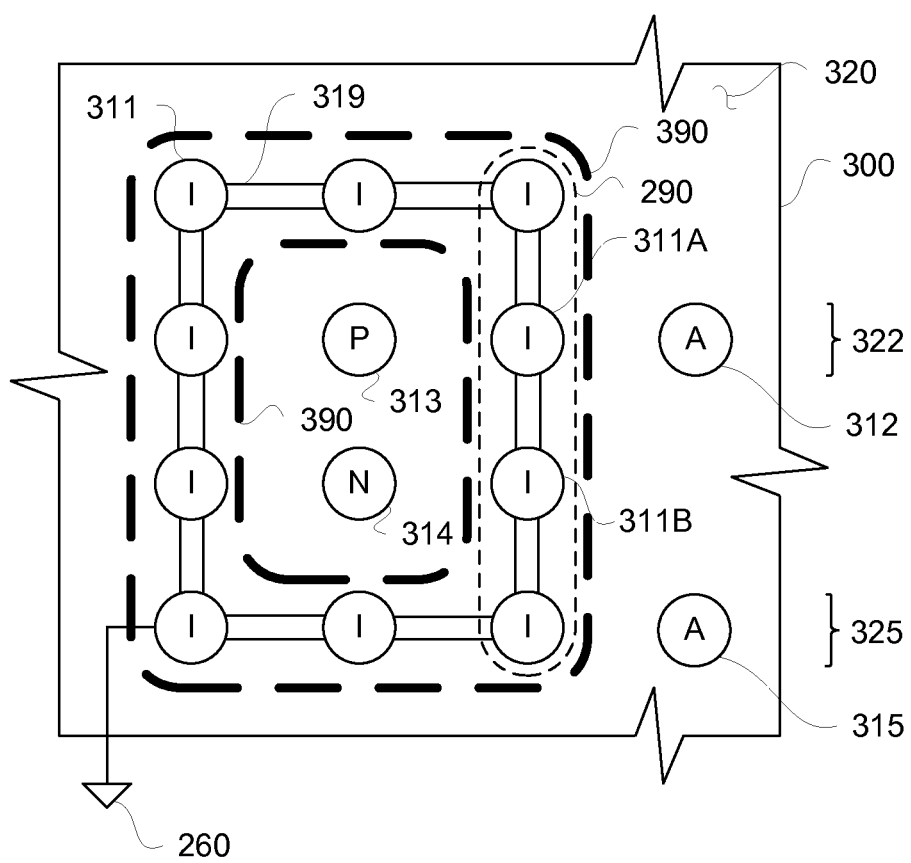
Figure 4:
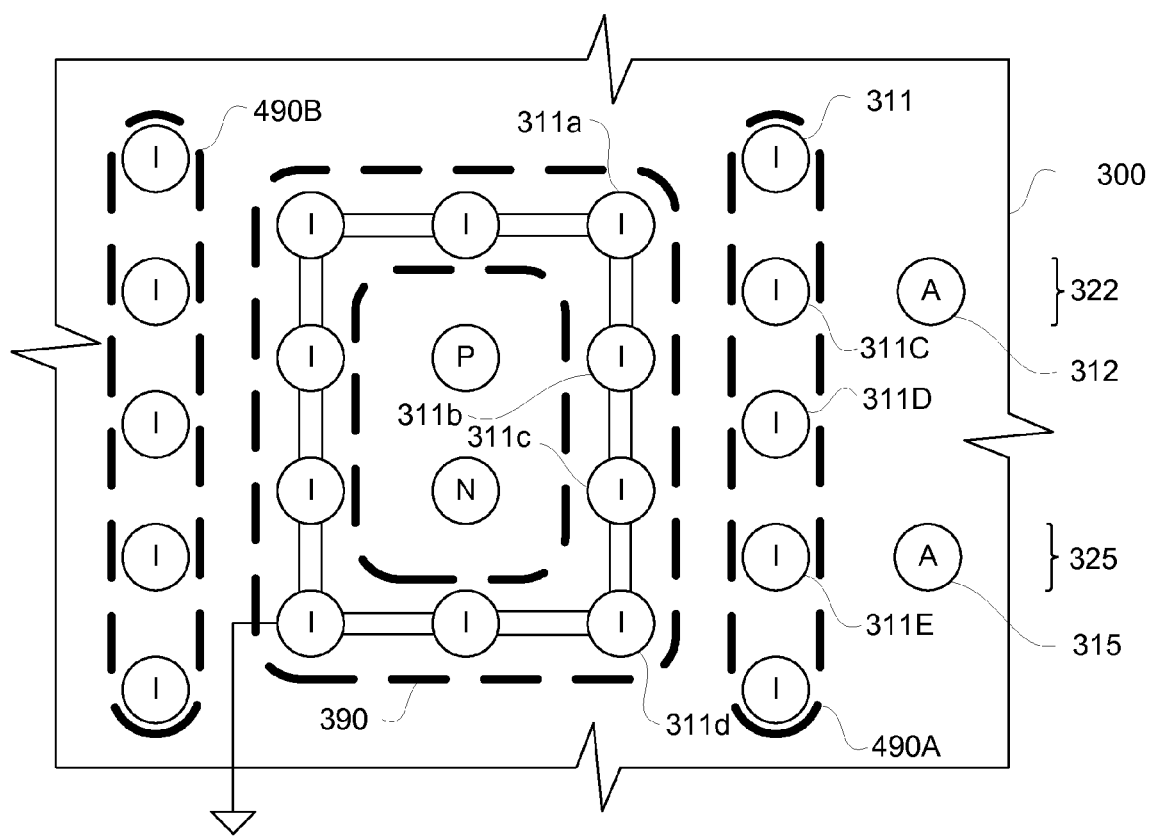

With reference to FIG. 2-4, still yet another embodiment of a device package 200 is illustratively depicted. This embodiment the same as that of FIG. 2-3, except that two package balls 207-1 are used for coupling respective vias 212-1 to ground 260. Package balls 207-1 are mainly in isolation region 220; however, portions of such package balls 207-1 may extend into one or more of regions 221 and/or 222.

FIG. 3 is a block diagram of a top elevation view depicting an exemplary embodiment of a circuit platform 300. Circuit platform 300 may be a substrate having one or more conductive layers, such as metal layers for example, and one or more transistors, such as generally indicated by box 510 of FIG. 5, namely transistor 510, for example. In other words, circuit platform 300 may be an active die, such as an active interposer, FPGA, PLD, data converter, or other type of integrated circuit die. However, for purposes of clarity and not limitation, it shall be assumed that circuit platform 300 is an interposer 203 or a package substrate 204, as previously described herein. Circuit platform 300 includes vias 311 and conductors 312 through 315.

Vias 311 may be for coupling to provide a noise attenuation wall 390. Noise attenuation wall 390 may be a ringlike wall structure or framework. Even though a ringlike wall framework is illustratively depicted, in other embodiments, noise attenuation wall may not surround one or more signal conductors. In such other embodiments, a noise attenuation wall may be positioned between one or more aggressor signal conductors and one or more victim signal conductors. However, for purposes of clarity and not limitation, a ringlike structure for a noise attenuation wall is further described. Noise attenuation wall 390 may include a noise attenuation wall 290, as previously described herein. Along those lines, vias 311 may be coupled like vias 211-1 or 212-1 to provide a noise attenuation wall around conductors 313 and 314. Even though noise attenuation wall 390 is illustratively depicted as formed with ten vias 311 in order to surround conductors 313 and 314, in other embodiments noise attenuation wall 390 may be formed with fewer or more than ten vias 311. One or more conductors, such as conductors 312 and 315, may be located outside of noise attenuation wall 390.

In this example, conductors 312 and 315 are used to conduct aggressor ("A") signals with respect to a differential signal conducted by conductors 313 and 314. In this example, conductor 313 conducts a positive side ("P") of a differential signal, and conductor 314 conducts a negative side ("N") of a differential signal. Even though two conductors are illustratively depicted as being surrounded by noise attenuation wall 390 fewer or more than two conductors may be surrounded by a noise attenuation wall as described herein. Furthermore, even though the example of a differential signal is used, other types of signals which are susceptible to noise may be conducted by one or more conductors located inside of noise attenuation wall 390.

Conductors 313 and 314, as well as conductors 312 and 315, are not coupled to vias 311. However, vias 311 for noise isolation ("I") may be coupled to one another for coupling to a ground 260 to provide noise attenuation wall 390. Vias 311 may be coupled to one another by one or more conductive layers used to provide one or more conductive lines 319. Conductive lines 319, or more generally conductive layers, may be at least approximately orthogonal with respect to vias 311, or more generally conductive fill layers used to provide vias 311.

Vias 311 may be spaced apart from one another to provide a framework for noise attenuation wall 390. However, even though electrically porous, vias 311 surrounding conductors 313 and 314 provide a noise barrier between such conductors 313 and 314 and conductors 312 and 315.

Vias 311 may extend to opposite surfaces of circuit platform 300. As illustratively depicted, vias 311 extend to a top surface 320 of circuit platform 300. However, vias 311 may likewise extend to a bottom surface (not shown) circuit platform 300, as did vias 211 or 212.

Positioning 322 and 325 of conductors 312 and 315, respectively, may correspond to positioning of at least two of vias 311, namely respectively vias 311A and 311B for example. Alignment of isolation vias 311 with aggressor signal conducting conductors may facilitate noise attenuation.

FIG. 4 is a block diagram of a top elevation view depicting another exemplary embodiment of a circuit platform 300. As many elements of the embodiment of circuit platform 300 of FIG. 4 are the same as that of FIG. 3, generally only the differences are described below for purposes of clarity.

With reference to FIG. 4, circuit platform 300 further includes outer noise isolation walls 490A and 490B formed using additional vias 311. In this embodiment, vias 311 are not illustratively depicted as being coupled to one another, however in another embodiment, vias 311 used to form one or more noise isolation walls 490A and 490B may be coupled to one another using traces, as previously described herein. Even though five vias 311 are illustratively depicted for each of noise isolation walls 490A and 490B, fewer or more than five vias may be used to provide a framework for structure for such noise isolation walls 490A and 490B.

Vias 311 of noise isolation walls 490A and 490B are located outside of and on opposite sides of vias 311 of noise attenuation wall 390. Thus, noise isolation walls 490A and 490B provide an outer wall or barrier, and noise attenuation wall 390 provides an inner wall or barrier. Vias 311 of noise isolation walls 490A and 490B may extend to opposite surfaces of circuit platform 300, as previously described.

Noise isolation wall 490A is located between an outermost perimeter of noise attenuation wall 390 and one or more conductors, such as conductors 312 and 315, use to conduct one or more aggressor signals. Likewise, noise isolation wall 490B may be located between an outermost perimeter of noise attenuation wall 390 and one or more other conductors used to conduct one or more other aggressor signals. Addition of noise isolation walls 490A and 490B provides a double walled framework for noise isolation for noise attenuation.

Positioning 322 and 325 of conductors 312 and 315, respectively, may correspond to positioning of at least two of vias 311, namely respectively vias 311C and 311D for example, of noise isolation wall 490A. Again, alignment of nearest isolation vias 311 to aggressor signal conducting conductors may facilitate noise attenuation.

Furthermore, to enhance electrical density to increase noise attenuation, vias 311 of each noise isolation wall 490A and 490B may be interleaved, though spaced apart, from corresponding vias 311 of noise attenuation wall 390. For example, a portion of vias 311, namely vias 311C through 311E, of isolation wall 490A are interleaved with respect to a corresponding portion of vias 311, namely vias 311a through 311d, of noise attenuation wall 390. In other words, vias of an external noise isolation wall may be interleaved with respect to corresponding vias disposed on a same side of a ringlike noise attenuation wall.

Figure 5:
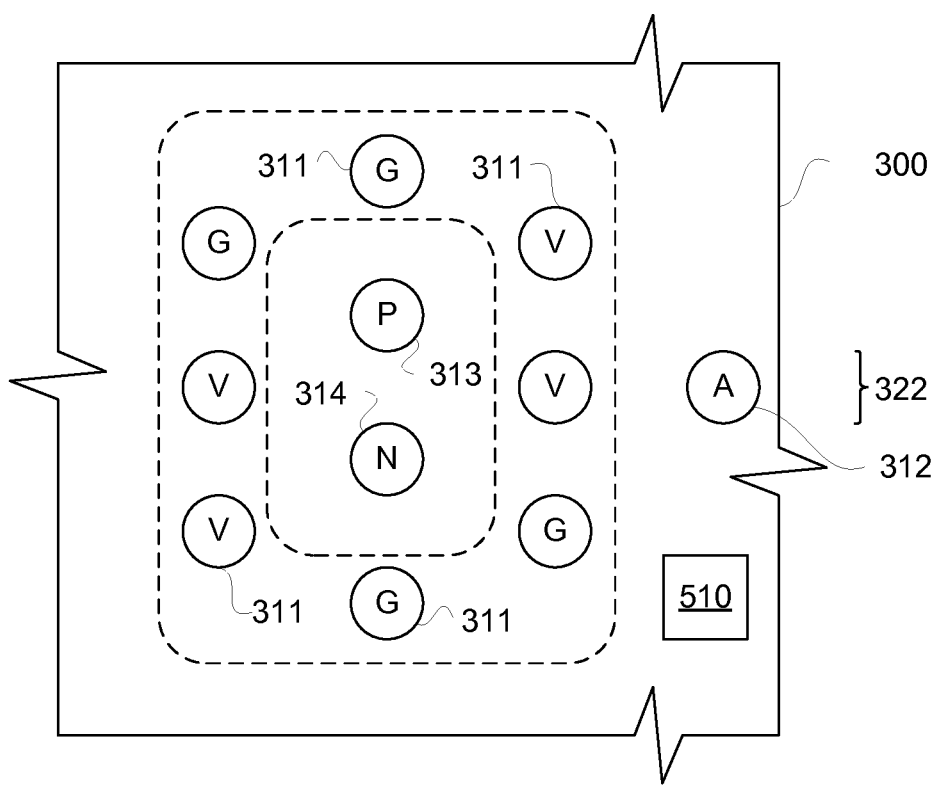
FIG. 5 is a block diagram of a top elevation view depicting yet another exemplary embodiment of a circuit platform.

FIG. 5 is a block diagram of a top elevation view depicting yet another exemplary embodiment of a circuit platform 300. As many elements of the embodiment of circuit platform 300 of FIG. 5 are the same as that of FIG. 3, generally only the differences are described below for purposes of clarity. Again, like circuit platform 300 of FIG. 3, circuit platform 300 of FIG. 5 may include one or more transistors 510. Noise attenuation wall 390 of FIG. 5 is formed using eight vias 311. However, a portion of vias 311 of noise attenuation wall 390 are coupled to one or more grounds ("G"), and a remaining portion of vias 311 of noise attenuation wall 390 are coupled to one or more DC supply voltages ("V").

Figure 6:
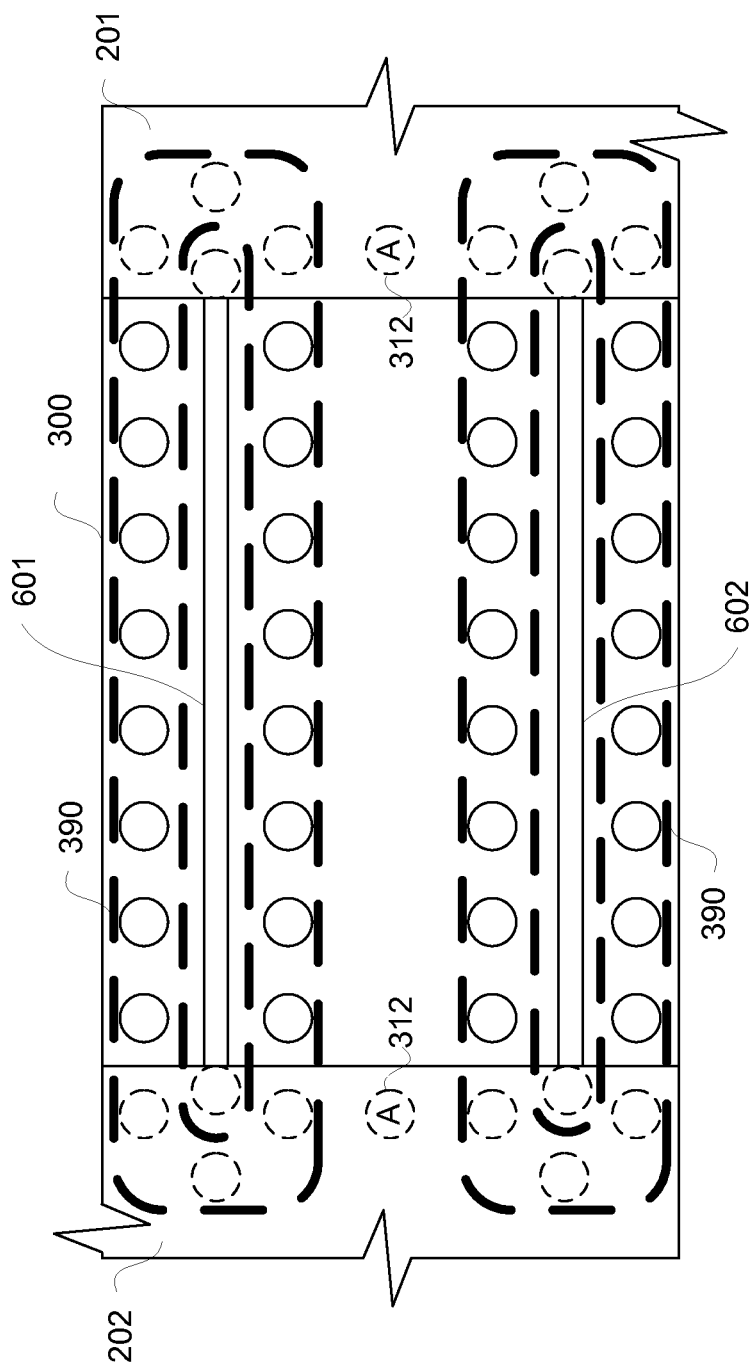
FIG. 6 is a block diagram of a top elevation view depicting still yet another exemplary embodiment of a circuit platform.

FIG. 6 is a block diagram of a top elevation view depicting still yet another exemplary embodiment of a circuit platform 300. As many elements of the embodiment of circuit platform 300 of FIG. 5 are the same as that of FIG. 3, generally only the differences are described below for purposes of clarity.

Noise attenuation walls 390 provide noise barriers for respective lanes or channels 601 and 602 for die-to-die communication by and between integrated circuit dies 201 and 202. Integrated circuit dies 201 and 202 may be packaged in a same integrated circuit package.

Again, even though the above description has generally been framed in terms of a passive interposer of a multi-die package, a noise attenuation wall formed using through substrate vias interconnected to one another may be formed in an active interposer and/or an active integrated circuit die, including without limitation an FPGA, a data converter, or other active die.

While the foregoing describes exemplary embodiments, other and further embodiments in accordance with the one or more aspects may be devised without departing from the scope thereof, which is determined by the claims that follow and equivalents thereof. claims listing steps do not imply any order of the steps. Trademarks are the property of their respective owners.

What is claimed is:

1. An apparatus, comprising:
an interposer having a plurality of first vias;
a plurality of first interconnects and a plurality of second interconnects respectively coupled on opposite surfaces of the interposer;
wherein a first portion of the plurality of first interconnects and a second portion of the plurality of first interconnects are spaced apart from one another defining an isolation region therebetween;
a substrate having a plurality of second vias;
a plurality of third interconnects and the plurality of second interconnects respectively coupled on opposite surfaces of the substrate; and
wherein a first portion of the plurality of first vias and a first portion of the plurality of second vias are both in the isolation region and are coupled to one another with a first portion of the plurality of second interconnects;
wherein each of the plurality of second vias of the first portion thereof extend to each of the opposite surfaces of the substrate and each of the plurality of second vias of the first portion thereof are coupled to one another within the substrate.

2. The apparatus according to claim 1, further comprising:
a first integrated circuit die coupled to the interposer with the first portion of the plurality of first interconnects; and
a second integrated circuit die coupled to the interposer with the second portion of the plurality of first interconnects.

3. The apparatus according to claim 2, wherein:
the first integrated circuit die includes analog circuitry coupled to the interposer with the first portion of the plurality of first interconnects; and
the second integrated circuit die includes digital circuitry coupled to the interposer with the second portion of the plurality of first interconnects.

4. The apparatus according to claim 1, further comprising an integrated circuit die coupled to the interposer with the first portion and the second portion of the plurality of first interconnects.

5. The apparatus according to claim 1, wherein the first portion of the plurality of first vias are coupled to a ground through the first portion of the plurality of second interconnects, the first portion of the plurality of second vias, and a first portion of the plurality of third interconnects.

6. The apparatus according to claim 5, wherein a second portion of each of the plurality of first vias, the plurality of second interconnects, the plurality of second vias, and the plurality of third interconnects are located outside of the isolation region.

7. The apparatus according to claim 6, wherein:
a first set of each of the second portion of each of the plurality of first vias, the plurality of second interconnects, the plurality of second vias, and the plurality of third interconnects is located in a first active region associated with operation of digital circuitry; and
a second set of each of the second portion of each of the plurality of first vias, the plurality of second interconnects, the plurality of second vias, and the plurality of third interconnects is located in a second active region associated with operation of analog circuitry.

8. The apparatus according to claim 1, wherein each of the plurality of first vias of the first portion thereof extend to each of the opposite surfaces of the interposer.

9. An apparatus, comprising:
a circuit platform comprising:
  a plurality of vias, at least a portion of the plurality of vias interconnected to one another using one or more conductive layers disposed at least approximately orthogonal with respect to the plurality of vias;
  at least one first conductor not connected to the plurality of vias;
  at least one second conductor not connected to the vias;
  wherein the plurality of vias are spaced apart from one another to provide a noise attenuation wall;
  wherein the plurality of vias surround the at least one second conductor to provide a noise barrier between the at least one second conductor and the at least one first conductor; and
  wherein the at least one first conductor is located outside of the noise attenuation wall.

10. The apparatus according to claim 9, wherein:
the at least one first conductor is for conducting at least one first signal;
the at least one second conductor is for conducting at least one second signal; and
the at least one first signal is an aggressor signal with respect to the at least one second signal.

11. The apparatus according to claim 9, wherein the plurality of vias extend to opposite surfaces of the circuit platform.

12. The apparatus according to claim 9, wherein the circuit platform is an interposer or a package substrate.

13. The apparatus according to claim 9, wherein:
the noise attenuation wall includes at least one double wall;
a first portion of the plurality of vias are used to provide at least one outer wall of the at least one double wall;
a second portion of the plurality of vias are used to provide a ringlike inner wall; and
the first portion of the plurality of vias are interleaved with respect to a subset of the second portion of the plurality of vias that are disposed on a same side of the noise attenuation wall as the at least one outer wall.

14. The apparatus according to claim 9, wherein:
a first portion of the plurality of vias are for coupling to one or more grounds; and
a second portion of the plurality of vias are for coupling to one or more supply voltages.

15. The apparatus according to claim 9, wherein the noise attenuation wall provides the noise barrier to provide a lane for die-to-die communication within a same package.

16. An apparatus, comprising:
a die having a plurality of through substrate vias, a plurality of transistors, and at least one conductive layer;
wherein the at least one conductive layer interconnects the plurality of through substrate vias to one another;
wherein the plurality of through substrate vias are spaced apart from one another to provide a noise attenuation wall;
a first conductor located on a first side of and not interconnected to the noise attenuation wall;
a second conductor located on a second side of and not interconnected to the noise attenuation wall;
wherein the first conductor is for conducting a first signal;
wherein the second conductor is for conducting a second signal;
wherein the first signal is a noise aggressor with respect to the second signal wall; and
wherein the noise attenuation wall is located between the first conductor and the second conductor to reduce noise caused by the first signal from being induced onto the second signal.

17. The apparatus according to claim 16, wherein the plurality of through substrate vias surround the second conductor to provide a noise barrier between the second conductor and the first conductor.

* * * * *